United States Patent
Hossain et al.

(10) Patent No.: US 10,263,761 B2
(45) Date of Patent: Apr. 16, 2019

(54) CLOCK AND DATA RECOVERY HAVING SHARED CLOCK GENERATOR

(71) Applicant: Rambus Inc., Sunnyvale, CA (US)

(72) Inventors: Masum Hossain, Edmonton (CA); Brian Leibowitz, San Francisco, CA (US); Jihong Ren, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 16/032,616

(22) Filed: Jul. 11, 2018

(65) Prior Publication Data

US 2019/0007189 A1 Jan. 3, 2019

Related U.S. Application Data

(63) Continuation of application No. 15/677,467, filed on Aug. 15, 2017, now Pat. No. 10,050,771, which is a (Continued)

(51) Int. Cl.
*H04L 7/00* (2006.01)
*H03L 7/23* (2006.01)
(Continued)

(52) U.S. Cl.
CPC .......... *H04L 7/0016* (2013.01); *H03L 7/1974* (2013.01); *H03L 7/235* (2013.01);
(Continued)

(58) Field of Classification Search
CPC .......... G01R 31/02; H03B 1/00; H03B 21/00; H03D 3/24; H03D 11/06; H03D 23/00;
(Continued)

(56) References Cited

U.S. PATENT DOCUMENTS 5,056,118 A 10/1991 Sun
5,384,551 A 1/1995 Kennedy et al.
(Continued)

FOREIGN PATENT DOCUMENTS

EP 0987853 3/2000
JP 2000-035831 A2 2/2000
(Continued)

OTHER PUBLICATIONS

Agrawal Ankur et al., "An 8×3 Gb/s Parallel Receiver With Collaborative Timing Recovery", ISSCC 2008 Session 25, Building Blocks for High-Speed Transceivers, 2008 IEEE. 3 Pages.
(Continued)

*Primary Examiner* — Shawkat M Ali

(57) ABSTRACT

This disclosure provides a clock recovery circuit for a multi-lane communication system. Local clocks are recovered from the input signals using respective local CDR circuits, and associated CDR error signals are aggregated or otherwise combined. A global recovered clock for shared use by the local CDR circuits is generated at a controllable oscillation frequency as a function of a combination of the error signals from the plurality of receivers. A voltage- or current-controlled delay line can also be used to phase adjust the global recovered clock to mitigate band-limited, lane-correlated, high frequency jitter.

20 Claims, 12 Drawing Sheets

Related U.S. Application Data continuation of application No. 15/339,342, filed on Oct. 31, 2016, now Pat. No. 9,768,947, which is a continuation of application No. 14/371,066, filed as application No. PCT/US2012/028912 on Mar. 13, 2012, now Pat. No. 9,577,816.

(51) Int. Cl.

| | | |
|---|---|---|
| *H03L 7/197* | (2006.01) | |
| *H04L 27/00* | (2006.01) | |
| *H04L 7/033* | (2006.01) | |
| *H04L 27/32* | (2006.01) | |

(52) U.S. Cl.
CPC .......... *H04L 7/033* (2013.01); *H04L 27/0014* (2013.01); *H04L 27/32* (2013.01); *H04L 2027/0016* (2013.01); *H04L 2027/0036* (2013.01); *H04L 2027/0053* (2013.01); *H04L 2027/0055* (2013.01); *H04L 2027/0067* (2013.01)

(58) Field of Classification Search
CPC . H03H 7/30; H03K 3/00; H03K 11/00; H03L 7/00; H03L 7/06; H03L 7/235; H03L 7/1974; H04B 1/40; H04B 3/46; H04B 7/00; H04B 17/00; H04L 7/00; H04L 7/0016; H04L 7/033; H04L 7/235; H04L 7/1974; H04L 25/00; H04L 25/03343; H04L 25/38; H04L 27/0014; H04L 27/23; H04L 27/32
USPC ........ 324/537, 555; 327/105, 108, 141, 156, 327/161, 299; 331/14, 57; 375/226, 233, 375/260, 346, 354, 355, 370, 371, 374, 375/376; 714/700, 704, 738
See application file for complete search history.

(56) References Cited

U.S. PATENT DOCUMENTS

| | | | |
|---|---|---|---|
| 5,442,315 A | 8/1995 | Hutchins | |
| 5,742,798 A | 4/1998 | Goldrian | |
| 5,799,048 A | 8/1998 | Farjad-Rad et al. | |
| 6,008,680 A | 12/1999 | Kyles | |
| 6,044,123 A | 3/2000 | Takla | |
| 6,075,416 A | 6/2000 | Dalmia | |
| 6,307,906 B1* | 10/2001 | Tanji | H03D 13/004 375/375 |
| 6,509,773 B2 | 1/2003 | Buchwald et al. | |
| 6,526,112 B1* | 2/2003 | Lai | H03L 7/07 375/375 |
| 6,725,408 B1 | 4/2004 | Cao | |
| 6,791,338 B1 | 9/2004 | Bratkovski et al. | |
| 6,995,594 B2 | 2/2006 | Buchwald et al. | |
| 7,012,983 B2 | 3/2006 | Buchwald et al. | |
| 7,016,449 B2 | 3/2006 | Buchwald et al. | |
| 7,058,150 B2 | 6/2006 | Buchwald et al. | |
| 7,099,424 B1* | 8/2006 | Chang | H03L 7/07 375/370 |
| 7,127,017 B1 | 10/2006 | Evans et al. | |
| 7,251,764 B2 | 7/2007 | Bonneau et al. | |
| 7,269,397 B2 | 9/2007 | Carballo et al. | |
| 7,397,876 B2* | 7/2008 | Cranford, Jr. | H04L 7/0337 375/355 |
| 7,471,691 B2 | 12/2008 | Black et al. | |
| 7,587,012 B2 | 9/2009 | Evans et al. | |
| 7,684,534 B2 | 3/2010 | Buchmann et al. | |
| 7,743,168 B2 | 6/2010 | Tang et al. | |
| 7,817,767 B2 | 10/2010 | Tell et al. | |
| 7,849,370 B2 | 12/2010 | Moshe et al. | |
| 7,853,836 B2 | 12/2010 | Takada | |
| 8,289,032 B2 | 10/2012 | Lee et al. | |
| 8,395,427 B1 | 3/2013 | Gao et al. | |
| 2002/0089356 A1 | 6/2002 | Perrott et al. | |
| 2004/0212416 A1 | 10/2004 | Buchwald et al. | |
| 2004/0250180 A1 | 12/2004 | Hotta | |
| 2005/0271137 A1 | 12/2005 | Kolze et al. | |
| 2006/0062341 A1 | 3/2006 | Edmondson et al. | |
| 2007/0001713 A1 | 1/2007 | Lin | |
| 2007/0058768 A1 | 3/2007 | Werner | |
| 2007/0206670 A1 | 9/2007 | Aziz | |
| 2008/0068056 A1 | 3/2008 | Poulton et al. | |
| 2009/0097606 A1* | 4/2009 | Hutchins | H03L 7/07 375/376 |
| 2009/0290672 A1 | 11/2009 | Ho | |
| 2010/0026314 A1 | 2/2010 | Schuttert | |
| 2012/0275494 A1 | 11/2012 | Ma | |
| 2013/0216014 A1 | 8/2013 | Kong et al. | |
| 2013/0262909 A1 | 10/2013 | Yang et al. | |

FOREIGN PATENT DOCUMENTS

| | | |
|---|---|---|
| JP | 2003-005831 A2 | 2/2000 |
| WO | WO-00/70460 A1 | 11/2000 |
| WO | WO-2013-137863 A1 | 9/2013 |

OTHER PUBLICATIONS

Agrawal Ankur et al., "An 8×5 Gb/s Parallel Receiver With Collaborative Timing Recovery", IEEE Journal of Solid-State Circuits, vol. 44, No. 11, Nov. 2009. 11 Pages.

Cypress Semiconductor Corporation, "Cypress Applications Handbook," Jan. 1996, pp. 6-26 to 6-33. 11 pages.

EP Official Communication dated Sep. 26, 2011 re EP Application No. 08157859.3. 5 pages.

International Search Report and Written Opinion dated Nov. 30, 2012 in International Application No. PCT/US2012/028912. 8 pages.

PCT International Preliminary Report on Patentability dated Sep. 25, 2014 (Chapter I) in International Application No. PCT/US2012/028912. 5 pages.

Perrott, Michael et al., "A Modeling Approach for (sigma)-(delta) Fractional-N Frequency Synthesizers Allowing Straightforward Noise Analysis," IEEE Journal of Solid-State Circuits, vol. 37, No. 8, Aug. 2002. 11 pages.

Ramezani et al., "An Improved Bang-Bang Phase Detector for Clock and Data Recovery Applications", 2001 IEEE, Department of Electrical & Computer Engineering, University of Toronto. 4 Pages.

Sidiropoulos et al., "A Semidigital Dual Delay-Locked Loop," IEEE Journal of Solid-State Circuits, vol. 32, No. 11, Nov. 1997, pp. 1683-1692. 10 pages.

Van De Beek, R.C.H., et al., A 2.5 to 10GHz Clock Multiplier Unit with 0.22 ps. RMS Jitter in a 0.18 um CMOS Technology, 2003 IEEE International Solid-State Circuits Conference. 10 Pages.

Yang, Chih-Kong Ken, "Delay-Locked Loops—An Overview", Phase-Locking in High-Performance Systems, IEEE Press, 2003. 10 Pages.

Yee et al., "An Integratable 1-2.5Gbps Low Jitter CMOS Transceiver with Built in Self Test Capability," 1999 Symposium on VLSI Circuits Digest of Technical Papers, pp. 45-46. 2 pages.

* cited by examiner

CLOCK AND DATA RECOVERY HAVING SHARED CLOCK GENERATOR

This application is a continuation of U.S. Utility application Ser. No. 15/677,467, filed on Aug. 15, 2017, which is a continuation of U.S. Utility application Ser. No. 15/339,342, filed on Oct. 31, 2016, which is a continuation of U.S. Utility application Ser. No. 14/371,066, filed on Sep. 24, 2014 under 35 USC § 371 as a national stage entry of Patent Cooperation Treaty Application No. PCT/US2012/028912 (filed Mar. 13, 2012). Each of the foregoing applications is which is hereby incorporated by reference.

TECHNICAL FIELD

The present invention relates generally to the field of electronic communications and more particularly to signaling between integrated circuit devices.

BACKGROUND

One class of digital data communication protocols use data signals that carry both the data stream and a data clock on a single channel. In these protocols, the receiving circuit includes a clock and data recovery CDR circuit which produces a recovered clock, based typically on a local reference clock that has a frequency close to that of the clock carried in the data signals. The receiving circuit uses the recovered clock to set sampling times for sampling the data signals on the channel. Phase differences between the recovered clock and the data signals can be detected and used as feedback in the generation of the recovered clock.

One limitation on the data rate in communication channels is jitter tolerance, where jitter is variation in the relative timing of the sampling times, which can be generally characterized as phase of the local recovered clock, and transitions in the data signals that correlate with the ideal sampling times for the data signals. In CDR based systems, jitter can arise from a number of sources. For example, some variations in the data clock due to transmitter-side circuits can cause relatively low frequency jitter. Also, power supply noise on either the transmitter-side or the receiver-side can cause higher frequency jitter. The CDR sampling window, or data eye, is narrowed by poor jitter tracking, limiting the maximum data rate than can be achieved.

An object of the technology described herein is to provide a CDR circuit, and a method for clock recovery, achieving improved jitter tolerance.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Clock recovery technology is provided in which a global recovered clock is produced for a plurality of lanes, responsive to feedback from the plurality of lanes. The global recovered clock is provided to each lane, where it is used for setting the sampling times on the respective lanes. The global recovered clock can be produced using a frequency tracking circuit, a phase tracking circuit, or a combination of frequency tracking and phase tracking circuits. The global recovered clock can also be produced using a voltage- or current-controlled delay line in response to a combination of error signals from the plurality of lanes. Both of this frequency tracking circuit and delay line can be optionally used together, and both can optionally be made part of a feedback loop, such as a locked loop. A shared frequency tracking loop can compensate for correlated frequency offsets in the different lanes, in response to a first combination of the error signals. A shared phase tracking loop can compensate for correlated jitter in the different lanes, as a band pass function of a second combination of the error signals.

In some detailed embodiments, a controllable oscillator can optionally be used to generate a timing signal at an oscillation frequency in response to accumulated error. A voltage controlled oscillator can be used for this purpose. Such a circuit provides for rapid clock multiplier unit convergence to a frequency that approximates the average of the various lanes' error signals, in a manner that minimizes dither jitter of local clock recovery circuits. Also in some detailed embodiments, a voltage- or current-controlled delay line can optionally be used to modify a global recovered clock responsive to collective lane error; that is, this delay line can be used to provide low latency band pass jitter tracking to compensate for high-frequency, lane-correlated jitter. These optional techniques can if desired be used together to provide for effective, low latency jitter compensation. In further specific embodiments, each of a voltage controlled oscillator and/or a voltage- or current-controlled delay line can be controlled in response to an analog voltage, providing for low latency adjustment of the global recovered clock.

Figure 1:
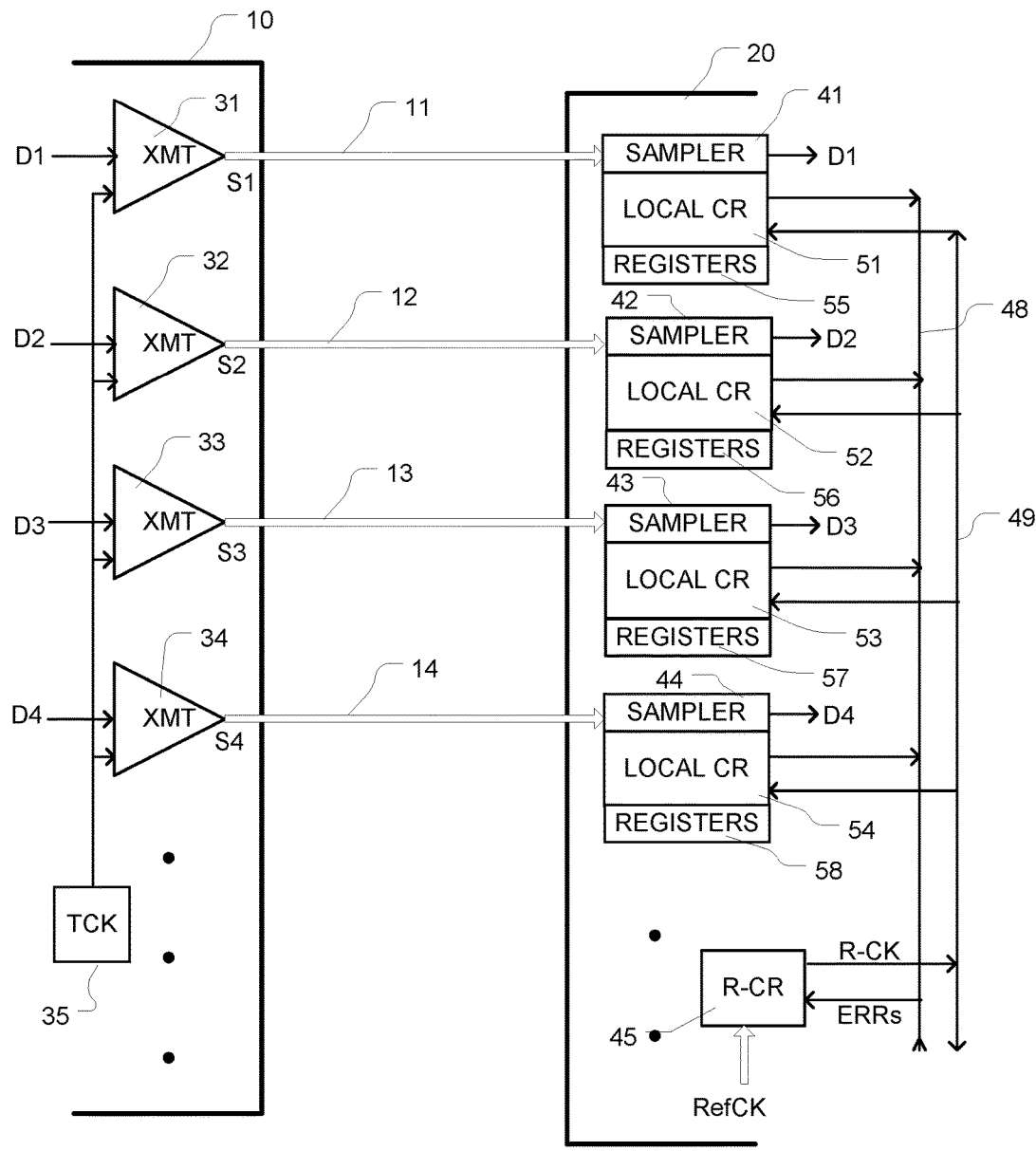
FIG. 1 is a simplified diagram of a system including clock recovery circuits as described herein.

FIG. 1 is a simplified diagram of a first integrated circuit 10 which is connected by a plurality of communication lines 11-14 to a second integrated circuit 20. In a representative embodiment, the first integrated circuit 10 comprises a memory controller and a second integrated circuit 20 comprises a memory device such as a dynamic random access memory (DRAM) integrated circuit. The first integrated circuit 10 in this embodiment includes transmitters 31-34 for driving respective data signals ("S1" to "S4"), each of which include a corresponding data stream "D1" to "D4," combined with a corresponding data clock (e.g. TCK), on the communication lines 11-14 to the second integrated circuit 20. A transmit clock generator 35 in this example produces the data clock which is provided to the transmitters 31-34 along with the data streams where they are combined to form data signals "S1" to "S4." As indicated in the drawing by the ellipses associated with the communication channels, the number of channels between the integrated circuits can vary from one to many. Note that in one embodiment, each transmitter 31-34 uses a respective data clock, which can be derived in some manner from the transmit clock generator 35 (e.g., each transmitter can transmit according to a respective phase). Note that other embodiments also exist, i.e., the various transmitters 31-34 can be on different chips transmitting to a common second integrated circuit 20. In addition, the techniques discussed below provide benefits where the respective data clocks are derived from a common source or otherwise correlated.

The data signals "S1" to "S4" can be produced according to a variety of known encoding protocols, from basic non-return to zero NRZ or Manchester encoded data to other encoding techniques applied in multilane, gigabit SERDES channels. For example, two frequently-used encoding techniques are 8b10b coding and 64b66b coding. These and similar schemes take a quantum of data (e.g., 8 bits representing 256 possible data values) and map these data points to a larger code space (e.g., 10 bit codes representing 1024 possible data values), relying on values which emphasize a certain minimum transition density for transmitted information; because only a small subset of the larger code space is needed to transmit valid values, that subset can be chosen in a manner that guarantees a certain density of bit value changes relative to previously transmitted codes, e.g., a transition no less frequently than every two clock periods, synchronized with a clock edge, for example. Through recovering a local clock synchronized to transitions in the associated data signal, it becomes possible to sample the data signals at times close to an ideal sampling time (e.g., a midpoint between successive rising and falling edges) and so maximize the likelihood of correct interpretation of the individual data symbols that make up the transmitted data. Note that the use of per-lane or per-information-signal clock recovery provides an alternative to periodic phase calibration between the various integrated circuits, i.e., through clock recovery, each receiver self-adjusts for phase drift and other timing changes to properly sample the incoming information signal.

The second integrated circuit 20 shown in FIG. 1 includes a receiver on each lane, corresponding to respective ones of the communication lines 11-14. These receivers in the illustrated example include corresponding samplers 41-44, which receive and sample the signals on the communication lines 11-14 at local sampling times determined using recovered clocks, and produce the corresponding data streams "D1" to "D4." A global clock recovery circuit 45 produces a global recovered clock R-CK shared by all lanes to produce a respective, local recovered clock to control local sampling times at the respective samplers 41-44.

In some embodiments, the plurality of receivers include detectors that provide local error signals correlated with timing differences between received data signals and local sampling times; these error local error signals can be in the form of phase error signals, such as "up/down signals" of a local CDR for the specific lane. The global clock recovery circuit 45 can then include a circuit to generate a combined error signal based on a combination of the various local error signals. If desired, this circuit can be embodied as a controlled loop circuit, such as a phase locked loop (e.g. the embodiment of FIG. 4 described below) or a delay locked loop (e.g. the embodiment of FIG. 9 described below), or both. Such a loop circuit is responsive to the combined error signal and to feedback of at least a characteristic of the global recovered clock. In FIG. 1, these local error signals (ERRs) are represented by numeral 48.

Note that FIG. 1 shows a reference clock input (RefCK) to the global clock recovery circuit. In some embodiments, this reference clock signal can be generated off chip; in other embodiments, including several prominent examples presented below, this timing signal is generated on-chip, using a controllable oscillator that matches an original frequency of oscillation as closely as possible to an average of the embedded clocks received by the second integrated circuit 20. The combined local error signals can be converted to an analog voltage, used to drive this controllable oscillator. For example, the various local error signals can be summed together and integrated using an accumulator and a delta-sigma modulator or other smoothing circuit to reduce quantization noise in an output of the accumulator. Such an embodiment is shown for example in FIG. 6 below. An output from the delta-sigma modulator can be used to generate a control voltage for a voltage controlled oscillator (VCO). Optionally, the global clock recovery circuit can also include a delay locked loop coupled to receive this timing signal. The delay locked loop can have a voltage- or current-controlled delay line to produce the global recovered clock from the timing signal from the controllable oscillator. If desired, the voltage- or current-controlled delay line can be made dependent on the local error signals as well, e.g., based on a simple sum of these error signals (to provide for example band-pass based correction for lane-correlated, high frequency jitter). This is to say, some embodiments use both a voltage controlled oscillator responding to an accumulator, for quick frequency convergence with minimal dither jitter, and a voltage or current controlled delay line to further adjust the global recovered clock for high frequency jitter that is correlated between lanes.

In the example shown FIG. 1, the global recovered clock (R-CK) is delivered across line 49 to local clock recovery circuits 51-54 associated with corresponding samplers 41-44, which use the global recovered clock to produce corresponding local recovered clocks.

Each lane includes error detectors for producing the local error signals. In this example, the local clock recovery circuits 51-54 include detectors, such as a "bang-bang" phase detector or the like, that indicate errors such as phase offsets, between a local sampling times and the data signals on the communication lines. In a given local clock recovery circuit, these locally detected errors are applied to a control loop, including for example a loop filter and a digital phase adjustment circuit, such as a multiplexer or an interpolator responsive to digital control signals. In this example, the reference clock for the digital phase adjuster is the global recovered clock, with each digital phase adjuster adjusting a local clock to provide sampling times on a per-lane basis.

The local clock recovery circuits 51-54 can be individually tuned using control registers 55-58, for example. The individual tuning provides for performance advantages that compensate for variations in the physical communication paths served by the corresponding receivers. For example, control register values can be used to enable and disable parts of the local clock recovery loops, such as second order elements and frequency tracking. The control register values can be used to set integral gain in the local clock recovery loops to change the speed of frequency tracking. The control register values can be used to set proportional gain in the local clock recovery loops.

As mentioned, the reference clock (RefCK) can be produced locally on the second integrated circuit 20, or provided from an external source, including for example a clock transmitted from the first integrated circuit 10, an off-chip oscillator, as a system clock, or via some other source as suits a particular embodiment. In one embodiment, the second integrated circuit 20 includes an embedded oscillator of a frequency approximately matching the expected data clock(s) carried in the data signals. In a second embodiment, the integrated circuit 20 includes a signaling pad that is coupled to electrically receive an off-chip clock as the reference; note that as these statements imply, the techniques applied herein are readily applicable to a pleisiochronous system, that is, where the reference clock is similar to but only approximately related to a clock used at a transmitter. The techniques provided herein can also be used in a mesochronous system, such as where an off-receiver-chip clock is based in an oscillator also used by one or more of the transmitters that send data signals to the second integrated circuit (e.g., a common reference clock). As noted earlier, if an embedded oscillator is used, in some embodiments, this may be implemented as a controllable oscillator that generates a timing signal having a oscillation frequency dependent on the local error signals.

In an embodiment of the technology described herein, the global clock recovery circuit 45 includes a voltage controlled oscillator (VCO) used for establishing the oscillation frequency of the global recovered clock. In an embodiment of the technology described herein, the global clock recovery circuit 45 includes an analog loop for phase adjustment, in which the analog loop can include a voltage or current controlled delay line used for adjustment of the phase of the global recovered clock. In an embodiment of the technology described herein, the global clock recovery circuit 45 includes both an analog loop, which can include a voltage controlled oscillator, for establishing the frequency of the global recovered clock, and an analog loop, which can include a voltage or current controlled delay line, for phase adjustment of the global recovered clock.

Figure 2:
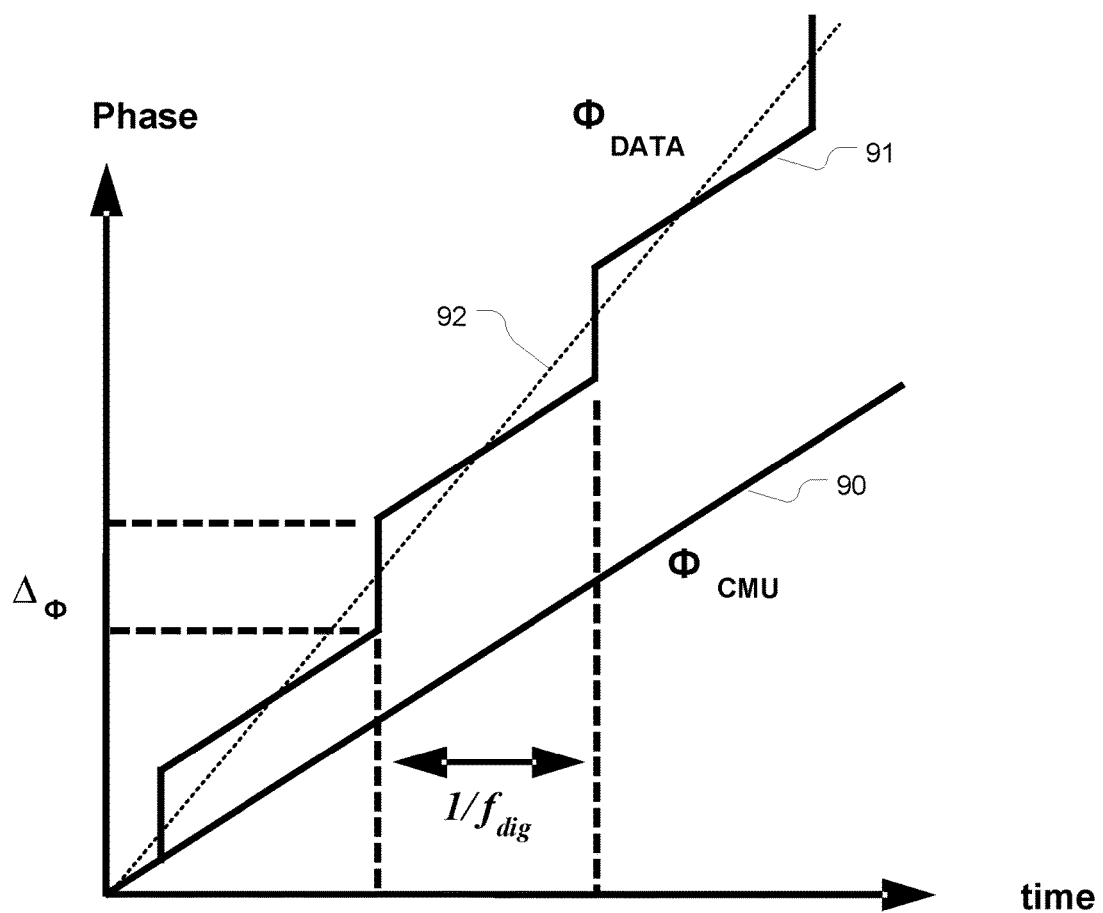
FIG. 2 is a graph of phase versus time, showing how phase tracking works in a phase interpolator based CDR, where there is a frequency offset between the data clock and receiver side clock.

FIG. 2 is used to provide an understanding of tradeoffs between frequency tracking bandwidth and high frequency jitter compensation implicated in the design of a CDR circuit. FIG. 2 is a graph of phase versus time, showing a first trace 90 which represents phase of a typical source clock used in a CDR (labeled as a clock multiplier unit output or CMU), a second trace 91 which shows the phase a local recovered clock, e.g., the dithering output of a phase interpolator (or other phase adjuster) based on use of the source clock as a reference. A third trace 92 shows the phase of a data clock which is embedded in a data signal of interest, and which the phase interpolator is attempting to replicate. The phase of the local reference clock on trace 91 is adjusted by the phase increments $\Delta_\phi$, at an update rate or frequency $f_{dig}$; this value defines the interval of time $1/f_{dig}$ between phase adjustments. The phase increment $\Delta_\phi$ and the frequency $f_{dig}$ of the loop have an effect on the jitter transfer function and the tracking range of the CDR receiver, as they translate to shifts in the sampling times at the respective receivers. That is to say, if the step size $\Delta_\phi$ is too large, each lane will experience excessive dither jitter (which can affect correct data sample interpretation and create power supply noise and other issues) and if the update frequency $f_{dig}$ is too slow, the effect can be the same (or can imply that the data frequency is out of range of the CDR circuit). This is further elaborated on as follows; loop latency in conventional CDR implementations can be 10-20 unit intervals (UI)—with such latency, increasing the proportional gain of the local loop to achieve higher tracking bandwidth results in significantly higher cycle jitter as each phase error signal produces a relatively greater change in recovered clock phase. As a result, in typical cases, the CDR tracking bandwidth is kept less than 10 MHz as a matter of design preference. This limitation on tracking bandwidth reduces the receiver's tolerance to high frequency jitter from other sources.

Another issue for clock recovery circuits using a shared phase locked loop PLL with per-lane digital clock and data recovery CDR circuits is the frequency offset tracking. Assuming there is a frequency difference between the clock multiplier unit output (e.g., the output of a PLL, trace 90) and incoming data signals (e.g. as represented by trace 92), the CDR needs to compensate for this frequency offset. Unfortunately, larger phase step sizes are required in the local digital clock recovery circuits to compensate for a reasonable amount of frequency offset (e.g. offsets >300 ppm). The reliance on larger phase step sizes for frequency tracking also results in higher cycle dithering jitter, degrading high frequency jitter tolerance.

Figure 3:
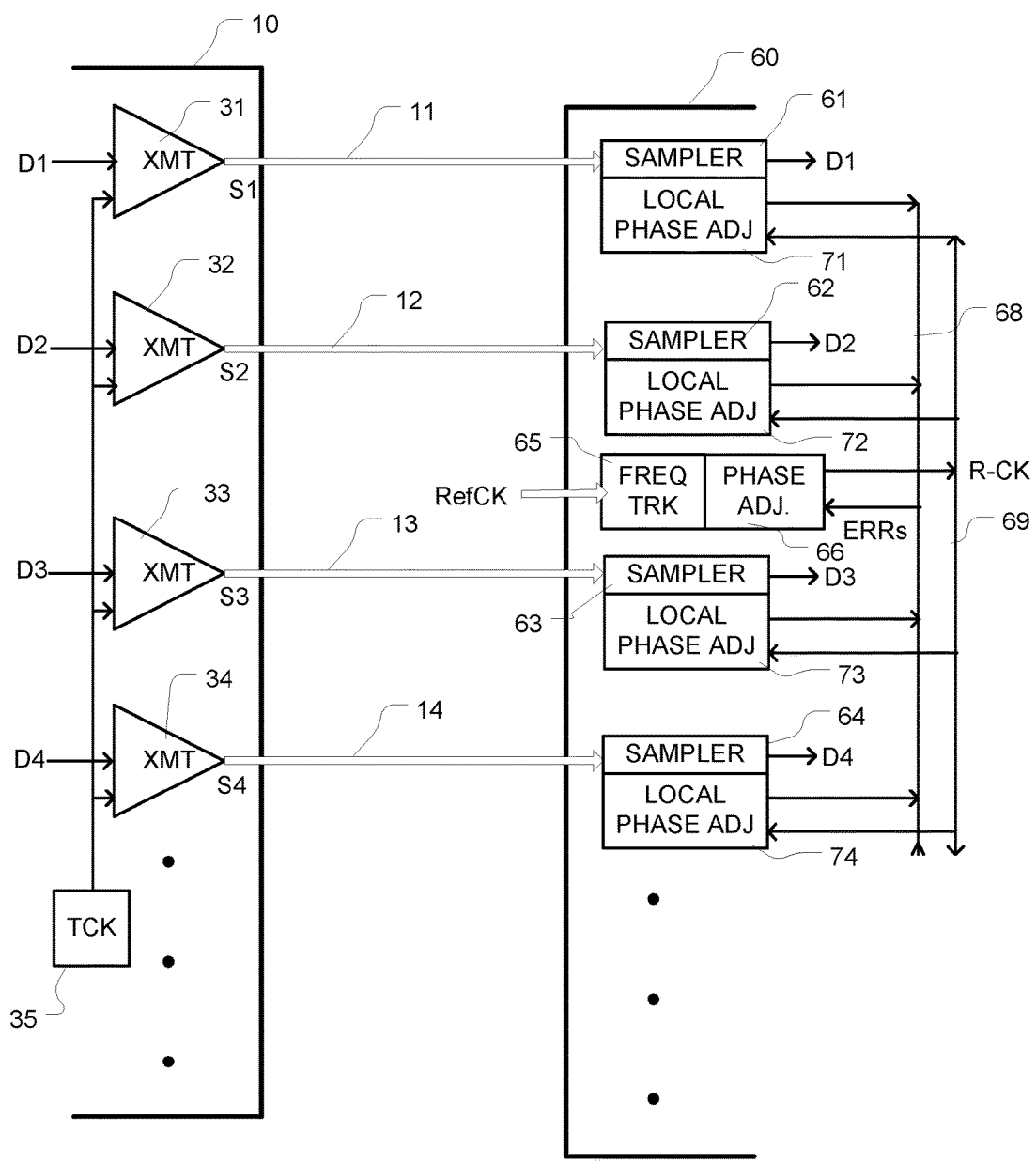
FIG. 3 is a simplified diagram of a system including clock recovery circuits as described herein, including global frequency and phase correction.

FIG. 3 illustrates features of embodiments of the technology described herein, in which the global clock recovery circuit includes both a frequency tracker 65 and a phase adjuster 66, while the per-lane, local clock recovery circuits include local phase adjusters 71-74. The frequency tracker can have a voltage controlled oscillator responsive to an accumulator, to change oscillation frequency, and the global recovery circuit phase adjuster can be implemented using a voltage or current controlled delay line, responsive to a simple sum of local error signals. The local clock recovery circuits can be any type of conventional clock recovery circuit, including for example, one that relies on a phase interpolator driven by feedback from a comparison circuit that compares interpolator output with transitions in the data signal. In FIG. 3, a first integrated circuit 10 (like that of FIG. 1) is connected by a plurality of communication lines 11-14 to a second integrated circuit 60. The first integrated circuit 10 in this embodiment includes transmitters 31-34 for driving respective data signals ("S1" to "S4" are shown), each of which include a corresponding data stream "D1" to "D4," combined with a corresponding data clock (e.g. TCK), on the communication lines 11-14 to the second integrated circuit 60. A transmit clock generator 35 in this example produces the data clock which is provided to the transmitters 31-34 along with the data streams where they are combined to form data signals "S1" to "S4."

The second integrated circuit 60 includes a receiver on each one of the communication lines 11-14. These receivers in the illustrated example include corresponding samplers 41-44, using local recovered clocks, and producing the corresponding data streams "D1" to "D4." The local recovered clocks are produced by local phase adjusters 71-74, such as digital phase interpolators which are each arranged in a control loop responsive to a respective local error signals associated with one of samplers 61-64. Each local phase adjuster 71-74 receives the global recovered clock across line 69. The global clock recovery circuit includes a combination of a frequency tracker 65 and a phase adjuster 66. The local error signals produced in each of the lanes corresponding with communication lines 11-14 are delivered on line 68 to the global clock recovery circuit, where they are combined and used to control both the frequency tracker 65 and the phase adjuster 66. For frequency tracking, the combined error signals can be accumulated or integrated, and modulated (using e.g. Delta-Sigma Modulation) to smooth quantization error, for use in control of a voltage controlled oscillator tracking the data clock. For phase tracking, the combined error signals can be summed, converted to analog and filtered to provide a control signal for a voltage or current controlled delay line.

Figure 4:
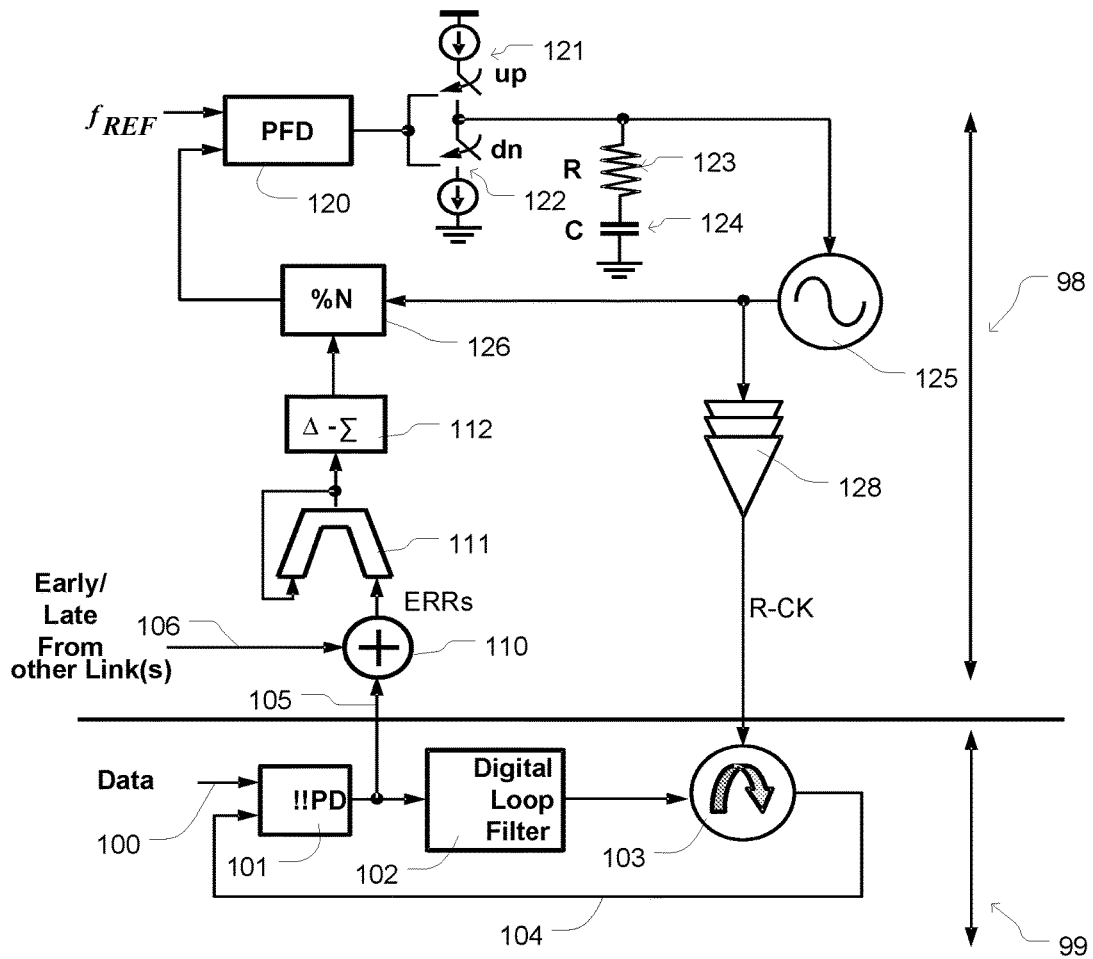
FIG. 4 is a diagram showing a global clock recovery circuit providing frequency offset correction and a local clock recovery circuit.

FIG. 4 is a diagram showing a global clock recovery circuit (upper portion 98) and a local clock recovery circuit (lower portion 99), which is replicated for each lane. The global clock recovery circuit 98 provides the global recovered clock R-CK to each of the local clock recovery circuits. Each local clock recovery circuit 99 provides error signals (e.g. signals on line 105) to a combining circuit or logic 110 which combines the error signals from a plurality of lanes (e.g. signals on line 106) to provide a combined error signal (ERRs) to the global clock recovery circuit 98.

In FIG. 4, the illustrated local clock recovery circuit receives the input data signal on line 100. This signal is then proceed by an error detector 101, such as a bang-bang phase detector. The error detector 101 generates a digital error signal, which is applied to digital loop filter 102. The digital loop filter 102 can be implemented to execute a wide variety of filter functions, including first-order filter functions or second-order filter functions. The output of the digital loop filter 102 is provided as a control input to an active element 103 in the loop, such as a digital phase interpolator, which produces the local recovered clock used for sampling the data. The output of the active element 103 is fed back on line 104 to the error detector 101.

The output of the error detector 101 is applied on line 105 to the a summing node 110 that combines this output with error signals on line 106 from other local clock recovery circuits. The combined error signal (ERRs) is provided to an accumulator 111, which integrates the error signals to produce a digital combined error signal. The digital combined error signal at the output of the accumulator 111 is applied to the Delta-Sigma (Δ-Σ) modulator 112 (also sometimes called a Sigma-Delta modulator). The Delta-Sigma modulator 112 produces a digital output which (once the global recovered clock is locked in a manner that tracks a fundamental frequency derived from the combined, accumulated error signals) is dithered at a very high rate between two, or a small number of, output levels, such that the average output value matches the input, smoothing the quantization noise of the digital input from the accumulator 111. The output of the modulator 112 is applied to a loop divider 126, implemented in this example by a fractional-N divider, which is part of a phase locked loop. The phase locked loop receives a reference clock having a reference frequency $f_{REF}$ at the input of a phase and frequency detector 120. The output of the detector 120 is applied to a charge pump including a pull-up stage 121 and a pull-down stage 122, which is coupled in turn to an analog loop filter in this example represented by the resistor 123 and the capacitor 124. The resulting signal is applied as a control input to a voltage controlled oscillator 125, causing the voltage controlled oscillator to track average data clock frequency. The signal produced at the voltage controlled oscillator 125 is provided to the loop divider 126. Also, the output of the voltage controlled oscillator 125 is applied through clock buffers 128 as the global recovered clock R-CK to the plurality of local clock recovery circuits, including local clock recovery circuit 99.

Figure 5:
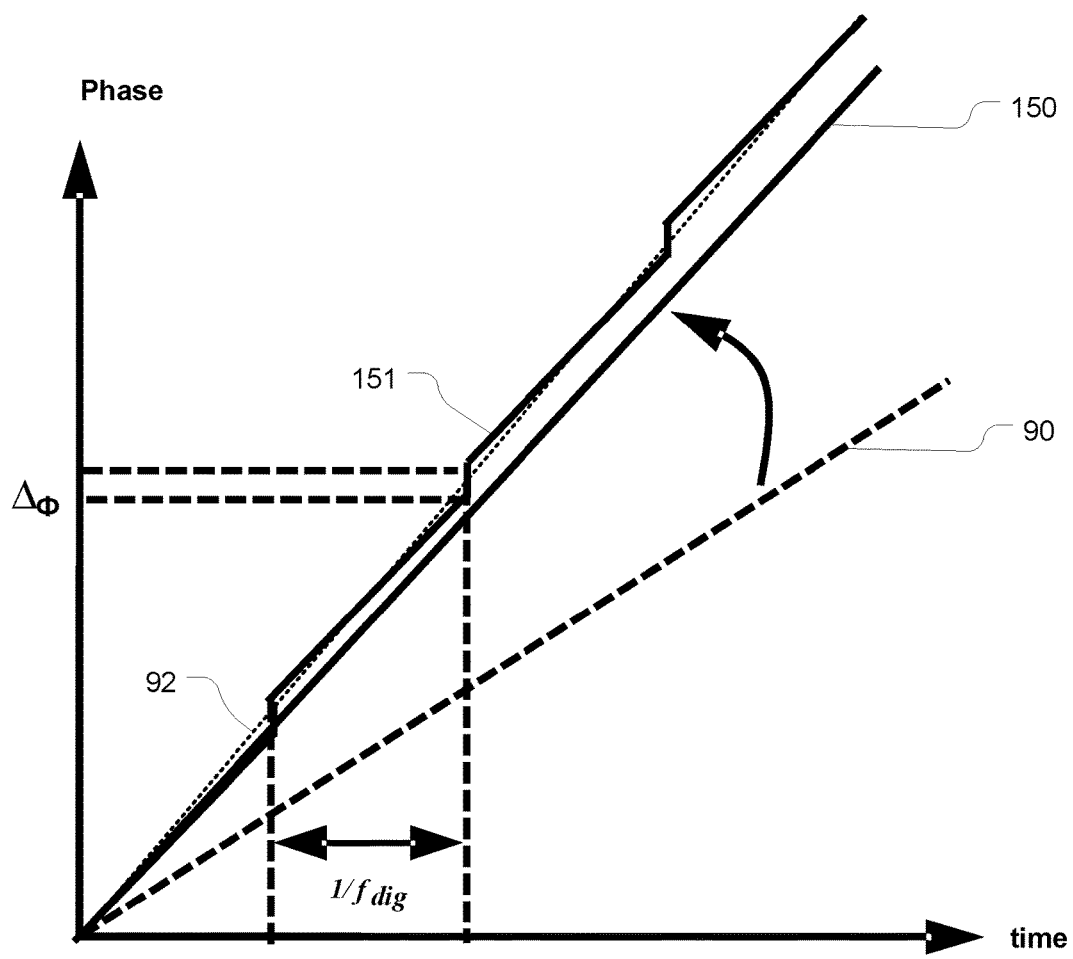
FIG. 5 is a graph of phase versus time showing an improvement in performance relative to FIG. 2, of a clock recovery circuit including per-lane clock recovery, for a system like that of FIG. 4.

One can understand the benefits of improved frequency tracking for a global recovered clock by comparing FIG. 5 with FIG. 2. FIG. 5 is a graph of phase versus time, showing the reference clock trace 90 from FIG. 2, and a second trace 92 which once again shows the phase of the clock embedded in the data signals of interest. Note that a third trace 150 is also illustrated, representing a global reference clock from a system like that of FIG. 4. That is to say, through use of the circuitry illustrated in that Figure, oscillation frequency itself can be generated much closer to the desired goal (represented by the second trace 92), as represented by arrow 152. A fourth trace 151 represents operation upon the global reference clock by one of the individual clock recovery circuits. In this example, the local recovered clock has a frequency that is controlled by the global recovered clock, and its phase is adjusted by the phase increments $\Delta_\phi$ using per-lane, digital phase interpolators. As illustrated by comparison with FIG. 2, the size of the phase increment $\Delta_\phi$ can be much smaller because the frequency offset between the local recovered clocks and the data signals is kept at a very small value by an active global clock recovery circuit.

Using a global recovered clock which tracks the frequency of the incoming data signals, a substantial reduction in the phase increments applied by the local clock recovery circuits is achieved. Smaller phase increments applied at local clock recovery circuits can further improve the jitter transfer function at higher frequencies. The combination of frequency tracking and phase adjustment at the global clock recovery circuit can facilitate a system having a further improved jitter transfer function.

Figure 6:
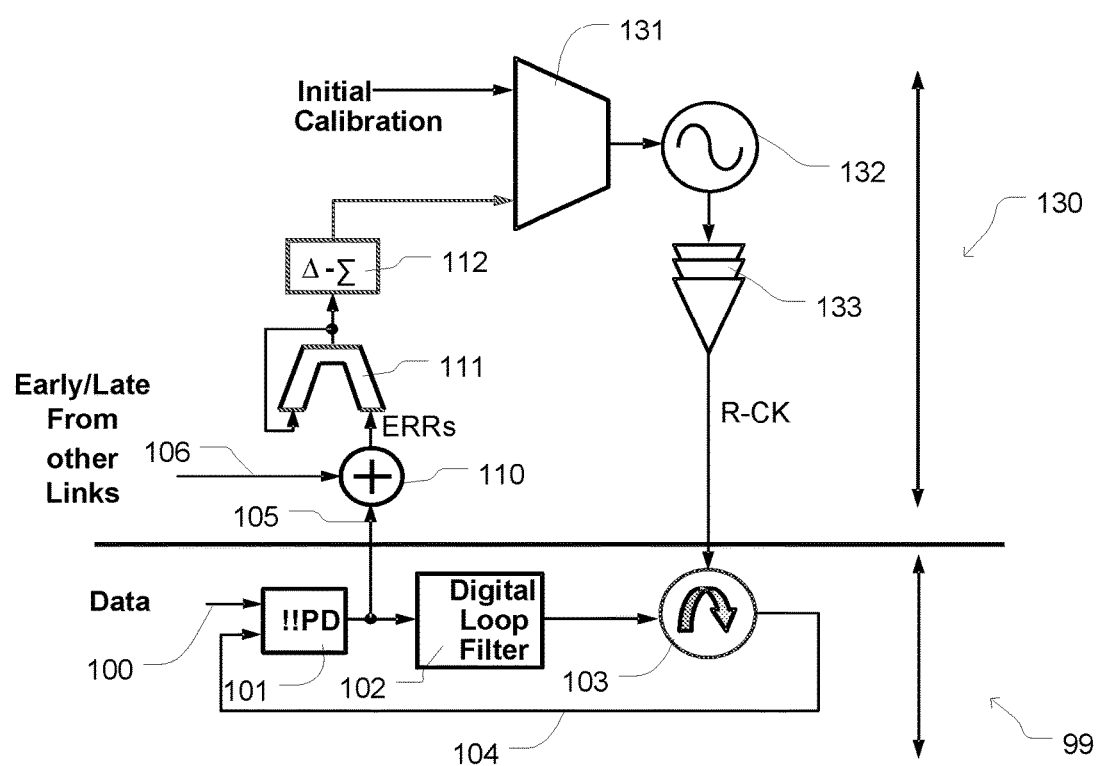
FIG. 6 is a diagram showing an alternative global clock recovery circuit providing frequency offset correction and phase alignment, coupled with a local clock recovery circuit.

FIG. 6 is a diagram showing a global clock recovery circuit 130 and a local clock recovery circuit 99, where the local clock recovery circuit 99 is represented by a schematic like that of FIG. 4. The reference numerals for components shown in FIG. 4 are the same in this diagram, and are not described again. In this embodiment, the global recovered clock (R-CK) is produced using a voltage controlled oscillator 132 in a configuration that is responsive to the error signals, but not to feedback of the global recovered clock. In this example, the control voltage for the voltage controlled oscillator 132 is provided at the output of a multiplexer 131. The inputs to the multiplexer 131 include an initial calibration value or other starting frequency setting, and the output of the Delta-Sigma modulator 112. The output of the voltage controlled oscillator 132 is provided through a buffer network 133 as the global recovered clock (R-CK) to the local clock recovery circuits, such as the circuit 99. Although not illustrated, a digital-to-analog converter and/or other filter, can be included in the circuit to smooth the variations in the control signals for the voltage controlled oscillator 132.

Figure 7:
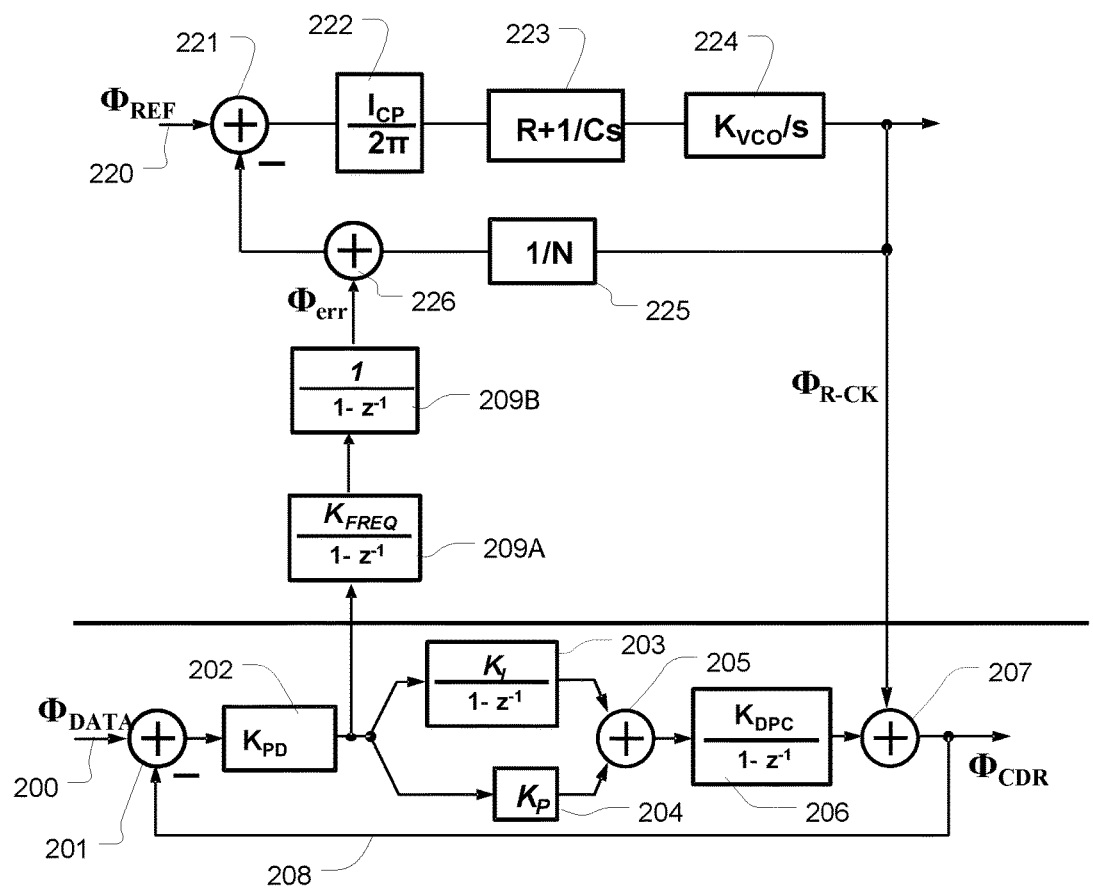
FIG. 7 is a frequency domain model of a circuit like that of FIG. 4.

The circuits 98 and 130 shown in FIGS. 4 and 6, respectively, and other circuits implementing a transfer function like that of FIG. 7, correspond to means, coupled to the plurality of receivers, for tracking frequency of the received data signals. Such circuits can control frequency offsets between the global recovered clock and the data signals. Also, the circuits shown in FIG. 8, corresponding to the frequency tracker 301, correspond to a means, coupled to the plurality of receivers, for tracking frequency of the received data signals. The function of such means can be responsive to combinations of the local error signals as described herein.

FIG. 7 shows a frequency domain model of a circuit like that of FIG. 4, which can be implemented using a variety of circuits. Note once again that the bottom portion of FIG. 7 shows but one local clock recovery circuit for ease of description, but in fact, there are typically plural such circuits, one for each lane of data. Each local clock recovery circuit receives the data phase signal $\phi_{DATA}$ on line 200 as an input to a summing node 201. An output of the summing node 201 represents detected phase error, and is provided to a gain circuit 202 to effectively multiply this phase error by $K_{PD}$. The signal is then applied to a loop filter, which in this embodiment includes two paths representing second order tracking. A first path ($K_P$) responds to detected phase difference, while a second path provides a second order or integrating element 204 ($K_I(1-z^{-1})$). The second order path effectively tracks inability of the first path to converge on the embedded clock, and provides additional frequency adjustment (e.g., through the use of a second phase step size or other means). Note that in some embodiments, only one of these paths need be included or used, i.e., the embodiment of FIG. 7 can be practiced using first order tracking only if desired. The outputs of the elements 203 and 204 are applied to another summing node 205, and fed to a digital phase controller 206 (having a transfer function of $K_{DPC}/(1-z^1)$). The output of this digital phase controller 206 is then fed back via on line 208 to the summing node 201 to derive detected phase error. The output of summing node 207 identifies the phase of the local recovered clock $\phi_{CDR}$.

The global recovered clock is produced in the global clock recovery circuit which comprises a phase locked loop responsive to the accumulated error signals. Thus, in the diagram of FIG. 7, the error signal at the output of the error detector 202 is applied to an accumulator 209A (along with error signals from other local clock recovery circuits). The transfer function of the accumulator is represented as ($K_{FREQ}/(1-z^{-1})$. The accumulator converts the phase error signals to the frequency domain, and then provides this frequency domain signal to a second accumulator 209B, implemented as a Delta-Sigma modulator as described above. The output of accumulator 209B provides an error signal $\phi_{err}$. Note that the effect of the accumulators is to average error signals from multiple local clock recovery circuits and to integrate those signals, e.g., the global clock is adjusted effectively to track average frequencies of the clocks embedded in the data signals carried by the multiple receiver lanes.

The accumulated phase error signal $\phi_{err}$ is then applied to summing node 226 in the phase locked loop. The output of the summing node 226 is applied to node 221 to take the difference between the phase of the reference frequency $\phi_{REF}$ on line 220 and the output of the summing node 226. The adjusted signal from this node 221 is applied to charge pump 222 (represented by the function $I_{CP}/2\pi$), to essentially perform a digital to analog conversion. The analog output of the charge pump is then filtered according analog loop filter 223 (R+1/Cs), and in turn, used as the control signal for a voltage controlled oscillator 224 (represented by function $K_{VCO}/s$). The voltage controlled oscillator output $\phi_{R-CK}$ is then provided to a the 1/N dividing node 225, which in turn provides a second input to the summing node 226. Reflecting on the operation of the circuit of FIG. 7, the voltage controlled oscillator 224 produces a signal having an oscillation frequency that is a function of the combined error signals from the various local clock recovery circuits.

Figure 8:
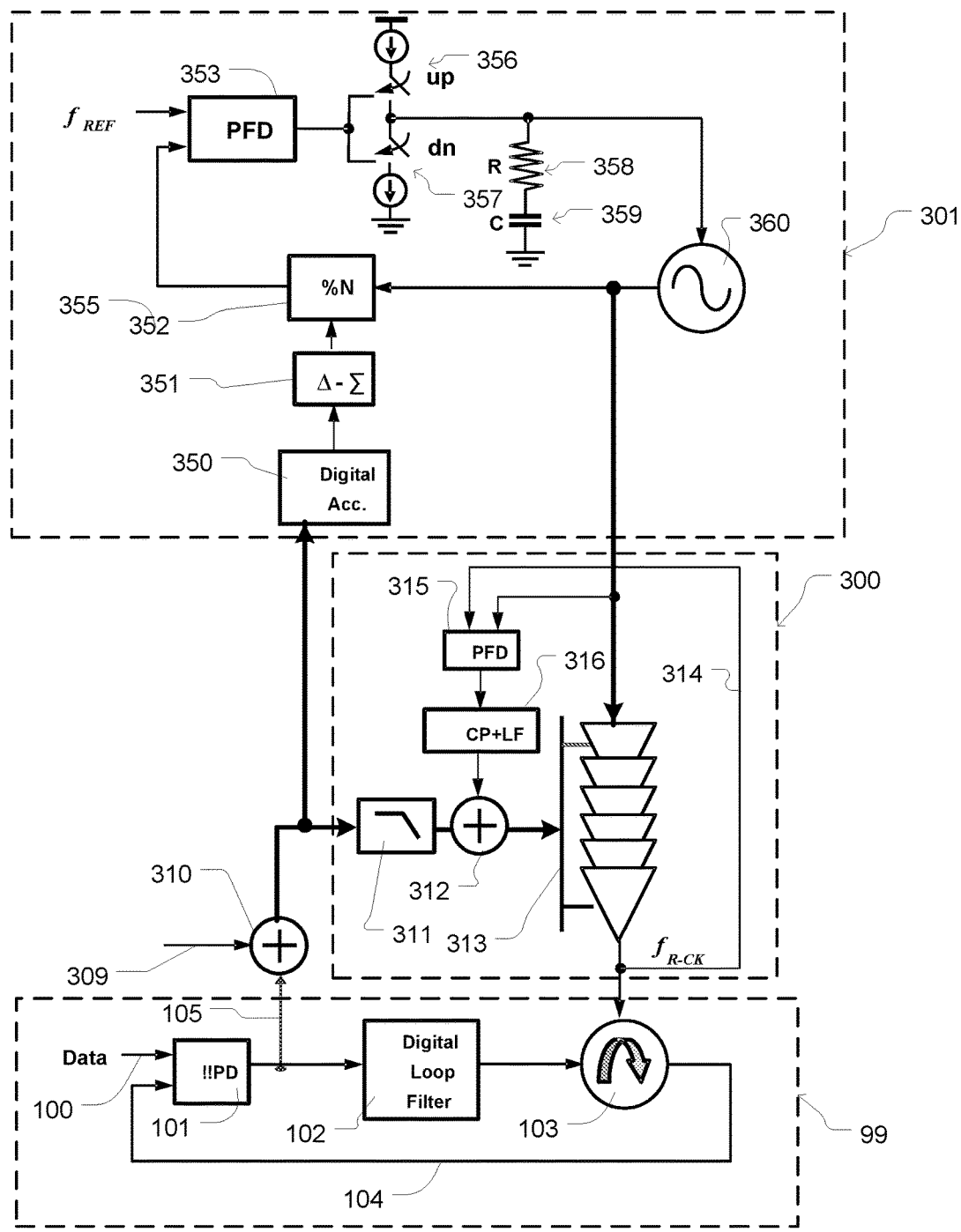
FIG. 8 is a diagram showing a global clock recovery circuit with global phase adjustment, and a local clock recovery circuit.

FIG. 8 is a diagram showing a global clock recovery circuit having both a frequency tracker 301 and a phase adjuster 300. The global clock recovery circuit is used with a plurality of local clock recovery circuits on the device (e.g., each for a different lane of data having an embedded clock). Only one such local clock recovery circuit illustrated in this Figure. The local clock recovery circuit 99 is illustrated in the same manner as that of FIG. 4, with like reference numerals, and not described again. The global clock recovery circuit includes a summing node 310 that receives the error signals on line 105, and, as represented by line 309, error signals from other local clock recovery circuits on the device. The error signals on line 105 (and 309) can be in the form of digital up/down signals such as produced using a bang-bang phase detector in each local clock recovery circuit 99. The output of the summing node 310, which represents a sum or instantaneous average of the error signals, is applied to a digital accumulator 350; the digital accumulator integrates the combination of error signals and in turn provides its output to a Delta-Sigma modulator 351. The Delta-Sigma modulator 351 controls a fractional N divider 352 used for the frequency tracker 301. The output of the fractional N divider 352 then is applied to a phase and frequency detector 353, the other input of which is a reference clock on line 355. An output of the phase and frequency detector 353 is applied to charge pump, represented by the pull-up stage 356 and the pull-down stage 357, to provide an amplified signal. This signal is then filtered through an RC path (i.e., resistor 358 and the capacitor 359), to generate an analog control signal for a voltage controlled oscillator 360. Thus, the voltage controlled oscillator is controlled to generate a frequency of oscillation to closely track the average frequency of embedded clock represented by the various data signals. By generating a timing signal reference that closely matches the typical embedded clock frequency, the size of the phase increments needed in the individual local clock recovery circuits at each update time can be reduced, thereby permitting for substantial reduction in dither jitter.

The phase adjuster 300 receives the frequency tracking clock from the voltage controlled oscillator 360 as an input to a delay locked loop (DLL). This DLL is rooted in a voltage-controlled delay line 313. Alternatively, a current-controlled delay line can instead be utilized. The output of the delay line is the global recovered clock $f_{R-CK}$, which is applied to the local clock recovery circuits. The effect of this delay line is to provide a low latency, band-limited feedback path for further jitter reduction, i.e., a control signal from node 312 is used to adjust the global recovered clock for jitter associated with a specific frequency band. Note that the output of the voltage controlled delay line 313 is fed back on line 314 to a phase and frequency detector 315 for the delay locked loop. The phase and frequency detector 315 generates an error signal which once again is applied to a charge pump and loop filter circuit 316 (CP+LF), and used for purposes of error comparison at node 312. Note that once again, the summing node (312) is used to produce an analog control voltage, although this time applied to the voltage-controlled delay line 313 (or current for a current-controlled delay line). The feedback loop formed by phase and frequency detector 315 and charge pump and loop filter 316 can act to keep the phase of $f_{R-CK}$ phase aligned with the frequency tracking clock from voltage controller oscillator 360 by setting the delay of the delay line 313 within its range to be nominally be one clock period. A second input to summing node 312 represents the combined error signals from the plurality of local clock recovery circuits. In this example, the error signals from the local clock recovery circuits are summed and provided at the output of the summing node 310 as input to the delay locked loop through a low pass filter 311. The low pass filter has a cut-off frequency that is relatively high, compared to that of the loop filter 102 in the local clock recovery circuits 99 and to the delay locked loop bandwidth discussed above. The effect of this circuit is therefore to urge the delay path to center at an integer number of clock periods, while the error signal path provides band limited corrections. Below the frequency represented by delay locked loop update frequency, the phase of $f_{R\text{-}CK}$ depends primarily on the phase of the frequency tracking clock produced by voltage controlled oscillator 360. These characteristics contribute to establishing a band pass transfer function for the phase adjustment circuit. Above the delay locked loop update frequency and below the cutoff frequency of filter 311 (i.e. within the pass band), error signals 105 and 309 are able to add or subtract phase to $f_{R\text{-}CK}$ to adjust the phase of the global recovered clock.

The shared DLL can track correlated jitter from the all data lanes. Most of the correlated jitter can be around mid-frequency (e.g. 50 MHz to 300 MHz for some high speed data channels), hence a band-pass phase transfer in the mid frequency range for the particular system (e.g. a 50 MHz to 300 MHz pass band) would be advantageous for systems susceptible to this type of jitter.

Figure 9:
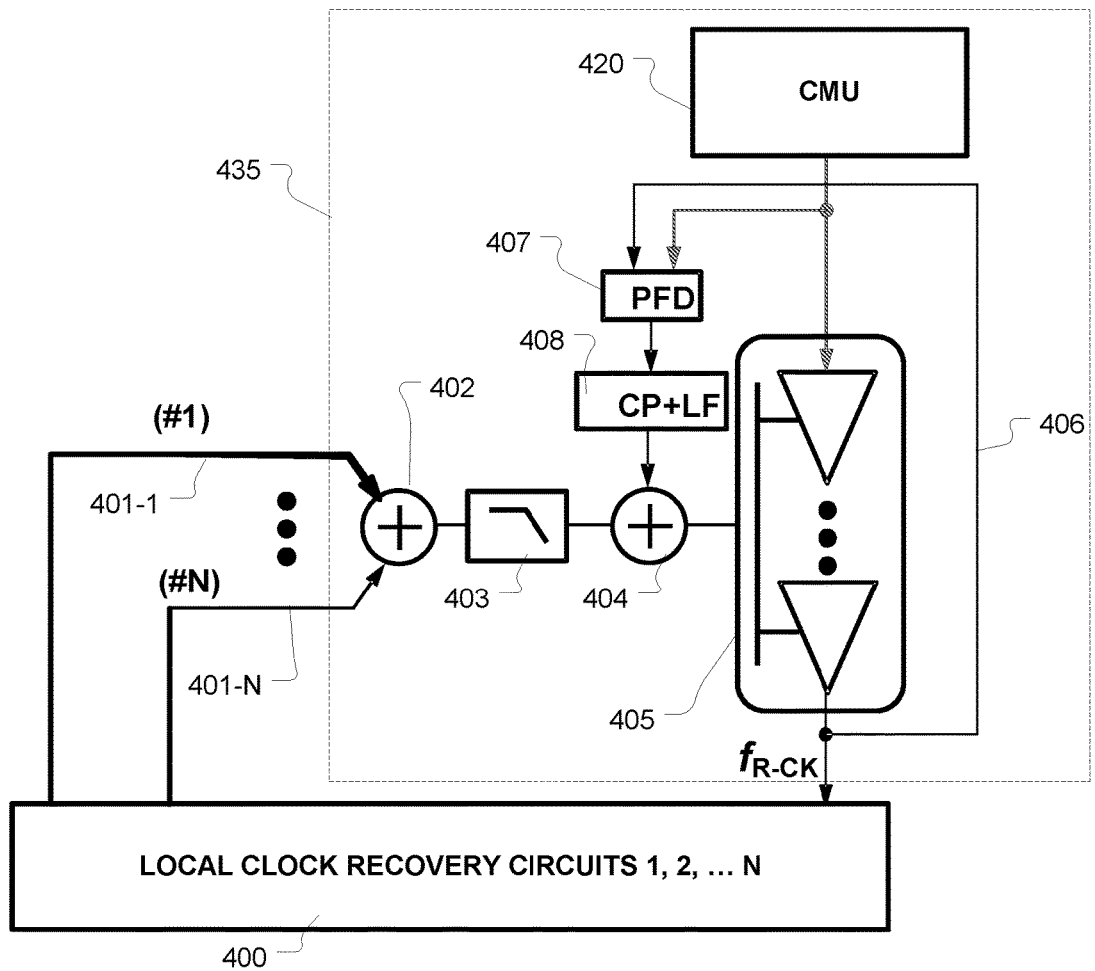
FIG. 9 is a diagram showing a phase aligning, global clock recovery circuit and multiple local clock recovery circuits.

FIG. 9 illustrates another embodiment, where the global clock recovery circuit comprises an analog phase adjustment circuit, without necessarily including a frequency tracker like that of FIG. 8. In this embodiment, there are a plurality of local clock recovery circuits 1, 2, . . . N, represented by block 400. A global recovered clock is produced by clock multiplier unit (CMU) 420. The CMU has a frequency selected to match that of the data clock carried by the data signals (e.g., it does not necessarily include a voltage controlled oscillator or other controllable oscillator, and can use any form of reference timing including without limitation one provided from off-chip). As with the embodiments presented earlier, local clock recovery circuits 400 produce respective error signals which are provided to on lines 401-1, . . . 401-N to summing node 402, which in turn is applied as input to filter 403. The summing node can if desired include voltage-to-current transducers for each incoming error signal line and a current summing circuit to generate an analog output. Alternatively, a digital to analog converter can used after digital summing with some latency penalty. The output of the filter 403 is applied to a second summing node 404, and used to generate a control signal for a voltage (or current) controlled delay line 405 (or other analog delay adjustment circuit). In various embodiments of the analog phase adjustment circuit, the delay line 405 can be less than 2.0 UI to limit its response to low frequency jitter represented by the combination of error signals; in some embodiments, the delay line has a range of about 1.0 to 1.5 UI. A DLL is implemented by feeding back the output of the voltage controlled delay line 405 via line 406 to a phase and frequency detector 407. The second input of the phase and frequency detector is a reference clock provided at the output of the CMU 420 in this example. The output of the phase and frequency detector 407 is applied to a charge pump and loop filter circuit 408, and then to the summing node 404, to provide feedback used to control the delay line 405. In this example, the global recovered clock has a phase that is adjusted in response to a combination such as a simple sum or average (e.g., instantaneous sum) of the local error signals. As a result of applying the signal representing the combination of error signals in analog form to adjust the control signal (at node 404), the phase adjustment circuit reacts to the jitter represented by the combination of error signals with low latency; as a result, relatively high frequency, correlated jitter from the all data lanes can be compensated. This results in a phase tracking circuit with a band-pass phase transfer function, that is, where low frequency cut off is based on the limited range of the delay line and high frequency cut off is based on the low latency of the feedback the circuit. This circuit operates in combination with local clock recovery circuits, thus providing a combination approach to jitter mitigation.

The circuit illustrated in FIG. 9, other than the local clock recovery circuits 400, corresponds to a means, coupled to the plurality of receivers, for aligning phase of the global recovered clock with the data signal. Also, the circuits shown in FIG. 8, corresponding to the phase adjuster 300, correspond to means, coupled to the plurality of receivers, for adjusting phase of the global recovered clock in response to a combination of the local error signals.

Figure 10:
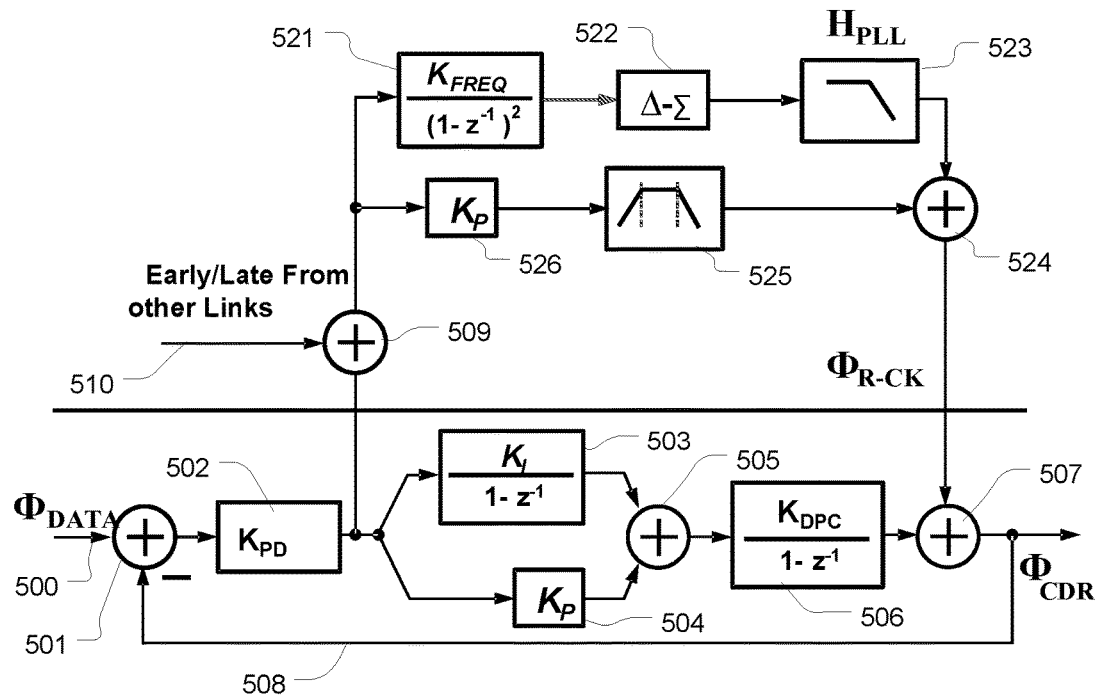
FIG. 10 is a frequency domain model of a circuit like that of FIG. 8.

FIG. 10 shows a frequency domain model of a circuit like that of FIG. 8, where the model can be implemented using a variety of circuits. The local clock recovery circuit is represented in the same basic way as in FIG. 7. Line 500 receives the data phase signal $\phi_{DATA}$ and provides it as an input to a summing node 501. The output of the summing node 501 is applied to the phase error detector gain 502, where it is multiplied by an effective phase detector gain ($K_{PD}$) to generate an early/late signal. This signal is then applied to the loop filter, which includes a second order or integrating element 503 ($K_I/(1-z^{-1})$), and a first order or proportional element 504 ($K_P$). Note that a single order filter can instead be used if desired. The outputs of the elements 503 and 504 are summed at node 505 and provided to a digital phase controller 506 ($K_{DPC}/(1-z^{-1})$). The output of summing node 507 is then fed back on line 508 to error detection node 501, and also provides the local recovered clock $\phi_{CDR}$.

The global clock recovery circuit receives the early/late signal from the error detector 502, and similar signals from other local clock recovery circuits at a summing node 509. The output of this node is then applied to a frequency tracking circuit including elements 521-523, and in parallel, to a phase adjusting circuit including elements 525 and 526. The outputs of these respective circuits are then summed at node 524 to produce the global recovered clock $\phi_{R\text{-}CK}$.

The frequency tracking circuit is represented by an accumulator 521 ($K_{FREQ}/(1-Z^{-1})^2$), a Delta-Sigma modulator 522 ($\Delta$-$\Sigma$) and a phase locked loop 523 ($H_{PLL}$). The phase adjusting circuit is represented by a phase adjustment element 525 ($K_P$) and a filter 526. Filter 526 is represented as a band pass filter in accordance with the delay locked loop dynamics discussed in regard to FIG. 8. In that context, the high-pass cutoff frequency is typically defined by the upper range of the loop bandwidth of the delay locked loop; that is, a high pass cutoff is provided by the maximum frequency at which the error detector output can adjust the delay of delay line. Although not shown in the diagrams, the global clock recovery circuit is configurable in some embodiments, by the use of control registers for example to set the proportional and integral gain values of components of the circuits.

Generally, the circuits 98 and 130 shown in FIGS. 4 and 6, respectively, and the circuit illustrated block 435 in FIG. 9, comprise various embodiments of means, coupled to the plurality of receivers, for generating the global recovered clock in response to the local error signals. Such embodiments include those configurable using control registers. Also, the circuits shown in FIG. 8, corresponding to the frequency tracker 301 and the phase adjuster 300, including embodiments configurable using control registers, correspond to means, coupled to the plurality of receivers, for generating the global recovered clock in response to the local error signals.

Note that the circuits described above provide for substantially reduced jitter. The optional use of global frequency tracking, that is, where an oscillation source is controlled responsive to averaged or accumulated local clock recovery circuits, provides for significantly less dither jitter; as mentioned, in specific embodiments, this circuit can be rooted in a voltage controlled oscillator that generates an oscillation frequency that closely tracks frequency an idealized source clock (representing correlation between the various embedded clocks). Other circuits can also be used. The optional use of a shared delay line to provide band-limited, low latency jitter correction permits cancellation of correlated jitter represented by the various embedded clocks (e.g., power supply induced jitter), with low frequency correction being addressed by other circuitry, and high frequency correction being limited by the update rate of the shared delay line. In specific embodiments indicated above, this delay line can implemented in the form of voltage- or current-controlled delay elements.

Figure 11:
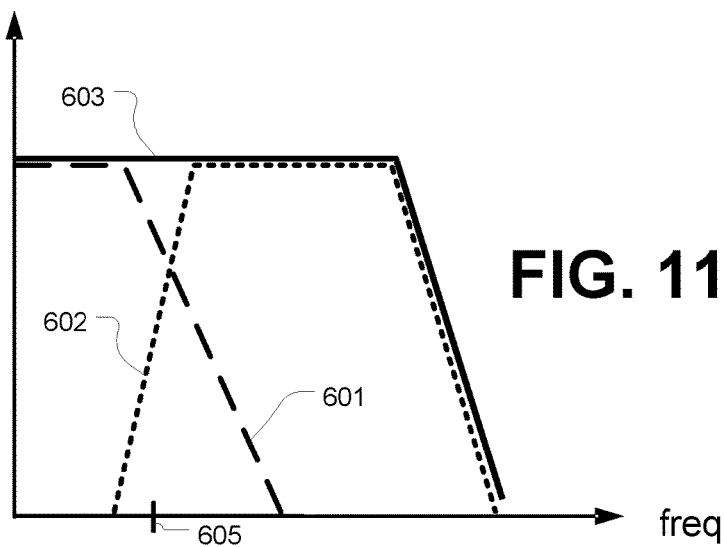
FIG. 11 is a graph showing a jitter transfer function for a circuit like that of FIG. 9.

FIG. 11 illustrates a jitter transfer function (from $\Phi_{DATA}$ to $\Phi_{CDR}$) showing the benefit of using a shared delay line as described. In FIG. 11, the vertical axis represents a ratio of $\Phi_{DATA}$ to $\Phi_{CDR}$, while the horizontal axis represents jitter frequency. The jitter transfer function includes a first component 601 that corresponds to a low pass transfer function of the local clock recovery circuit with a cutoff frequency indicated by point 605 on the graph. The cutoff frequency of the entire clock recovery circuit is increased beyond this cutoff frequency by the use of global delay line to compensate for high frequency correlated jitter, as represented by a second jitter transfer function component 602. The combined jitter transfer function represented by trace 603 on the graph in FIG. 11 provides substantially improved performance for data communications rooted in multiple embedded clocks with correlated high-frequency jitter.

Figure 12:
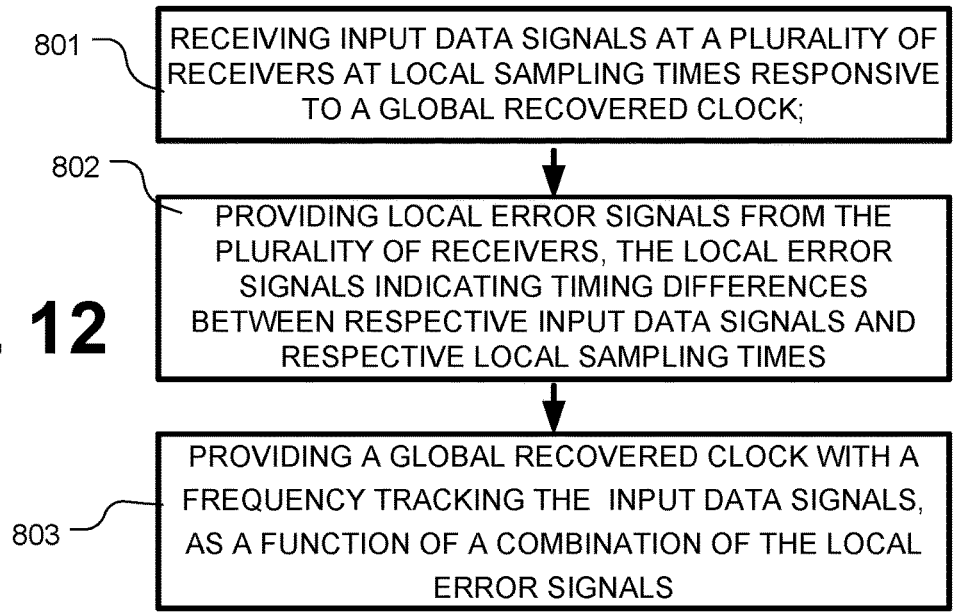
FIG. 12 illustrates a method for clock recovery in a multi-lane data communication system between devices, with shared frequency tracking.

FIG. 12 illustrates a method for clock recovery in a multi-lane data communication system between devices. The method includes receiving input data signals at a plurality of receivers at local sampling times responsive to a global recovered clock (801), providing local error signals from the plurality of receivers, the local error signals indicating timing differences between respective input data signals and respective local sampling times (802), and providing a global recovered clock with a frequency tracking the input data signals, as a function of a combination of the local error signals (803). As indicated for embodiments above, the frequency tracking can be performed using a controllable oscillation source that generates a frequency closely matched to a clock source presumptively used at some point in the clock generation paths for the various input data signals. These techniques can be applied to substantially minimize the phase step sizes (e.g., and dither jitter) applied in local data signal clock recovery.

Figure 13:
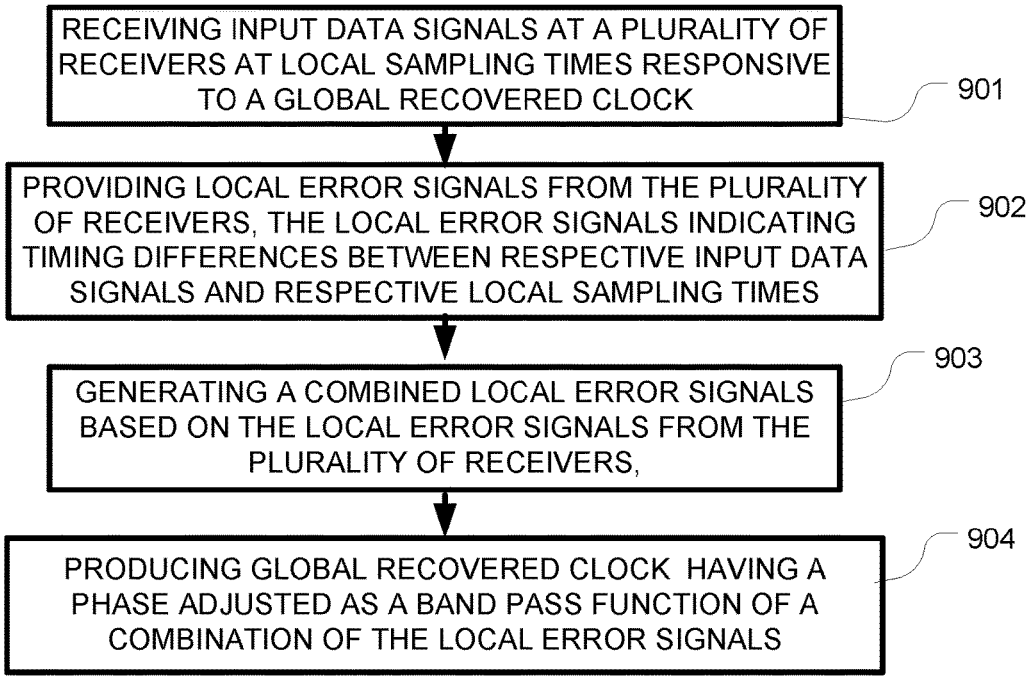
FIG. 13 illustrates another method for clock recovery in a multi-lane data communication system between devices, with shared, band pass phase adjustment.

FIG. 13 illustrates another method for clock recovery in a multi-lane data communication system between devices. The method includes receiving input data signals at a plurality of receivers at local sampling times responsive to a global recovered clock (901), providing local error signals from the plurality of receivers, the local error signals indicating timing differences between respective input data signals and respective local sampling times (902), generating a combined local error signals based on the local error signals from the plurality of receivers (903), and producing global recovered clock having a phase adjusted as a band pass function of a combination of the local error signals (904), by for example using a delay locked loop including a voltage or current controlled delay line in response to the combination of the local error signals and the global recovered clock. As indicated, this method can be applied to correct for high frequency jitter correlated amongst the embedded clocks of the various input data signals.

Figure 14:
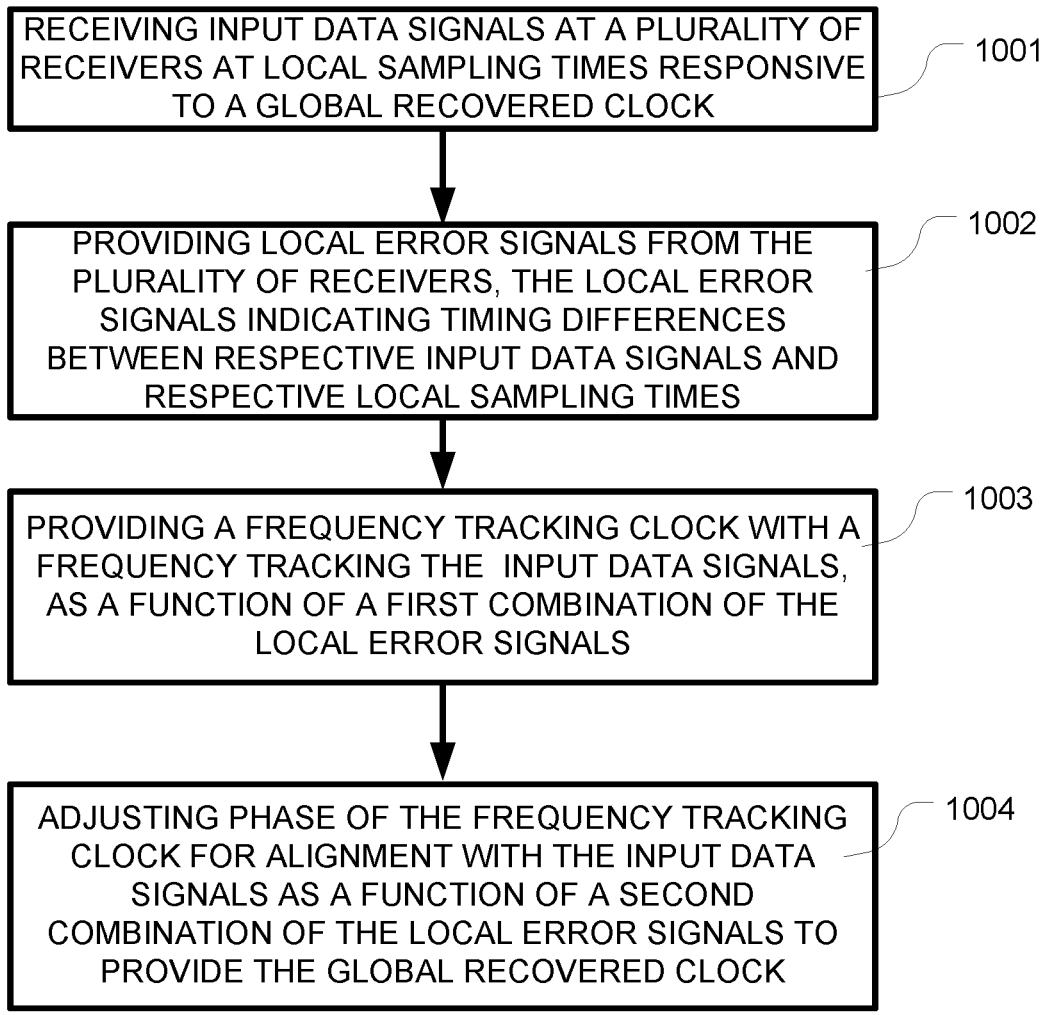
FIG. 14 illustrates yet another method for clock recovery in a multi-lane data communication system between devices, with a combination of shared frequency tracking and shared phase adjustment.

FIG. 14 illustrates a yet another method for clock recovery in a multi-lane data communication system between devices. The method includes receiving input data signals at a plurality of receivers at local sampling times responsive to a global recovered clock (1001), providing local error signals from the plurality of receivers, the local error signals indicating timing differences between respective input data signals and respective local sampling times (1002), providing a frequency tracking clock with a frequency tracking the input data signals, as a function of a first combination of the local error signals (1003), and adjusting phase of the frequency tracking clock for alignment with the input data signals as a function of a second combination of the local error signals to provide the global recovered clock (1004). Once again, in specific embodiments, this can optionally be performed using a controllable oscillation source to perform the frequency tracking, and using a voltage- or current-controlled delay line to adjust the global recovered clock within a specific frequency band.

A shared global CDR combined with per-lane, local digital CDRs is described. Rather than using only the early/late information of a single data lane, combined early/late information from a set of data lanes is used for the global CDR. Early/late information from different data lanes can be combined linearly to estimate the timing error. This also reduces the effect of data-dependent jitter on recovered clocks. As an optional feature, the global CDR can be based in a controllable oscillation source such that a frequency for the global clock is generated that closely approximates a shared source presumptively used for the various transmit clocks, that is, as opposed to phase dithering back and forth to attempt match this frequency. This can be implemented for example using a voltage controlled oscillator to generate the global recovered clock. As a second optional feature, a shared DLL can be used to track out the high frequency jitter that is common to (or correlated between) all data lanes. To reduce latency, a simple analog loop can be used with a voltage or current controlled delay line. Voltage or current controlled delay lines can be used that have a limited deskew range, such as on the order of 1-2 UI. This is acceptable since it is possible to reduce the mid-frequency jitter (i.e. in the range of about 30 MHz-150 MHz) within 2 UI. In addition, to avoid saturating the delay line, band pass phase transfer characteristics are applied in the shared DLL. Based on simulation results, the shared DLL bandwidth can be higher than 100 MHz.

In a typical multi-lane SERDES application, a frequency offset between incoming data and receiver side reference clock PLL is common for all the local CDRs. Hence, a frequency tracking loop can be shared as described herein. The shared frequency tracking can be fundamentally different than conventional approaches, because rather than using the phase interpolator in the local CDR lane to compensate for the frequency offset, the VCO of the shared PLL is re-aligned to the incoming data frequency. This can be done by adjusting the division ratio in the PLL feedback path as shown in the illustrated examples.

There are several advantages to the approaches described here. First, the quantization noise is low pass filtered by the shared PLL bandwidth, which significantly reduces the dithering jitter. This advantage can be further enhanced by inserting a Delta-Sigma modulator in the frequency tracking path. Second, in the conventional solution, the use of digital phase adjusters to compensate for the frequency offset causes both integral non-linearity (INL) and differential non-linearity (DNL) to translate to dithering jitter. This however is not the case in some approaches described herein. Since the local phase interpolators in circuits described herein do not need to compensate for the frequency offset, local CDR dithering is only limited to the DNL of the phase interpolator.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. A memory including computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

As described above, per-lane digital CDR can be simplified to optimize steady state sampling point and track only low frequency jitter. A shared analog loop can be used both to track high frequency jitter and to track frequency offset, thereby achieving better jitter tolerance. Latency can be reduced by keeping the delay locked loop analog. Since power used in the shared loop can be amortized over multiple data lanes, actual power penalty is not significant.

A shared PLL can be used to filter the quantization noise of the local Digital CDRs, decoupling the digital clock rate at the local CDR from frequency offset tracking. As a result, both phase and frequency resolution can be much higher in the clock recovery circuits.

A shared DLL is described that provides band pass, low latency jitter tracking. The band-pass characteristic of the shared DLL provides good correlated jitter tracking and combining data from multiple lanes with different data provides less sensitivity to data dependent jitter DDJ.

Combinations of above methods achieve both frequency offset tracking and high frequency jitter tracking.

An example described herein can be characterized as a CDR with shared frequency tracking which adjusts a shared VCO based on inputs from multiple lanes between two devices sharing a common frequency source. In addition, examples of the CDR described herein include quantization noise shaping to further reduce the dithering jitter.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, lanes or other interconnections between integrated circuit devices or internal circuit elements or blocks may be shown as buses or as single signal lines. Each of the buses may alternatively be a single signal line, and each of the single signal lines may alternatively be buses. Signals and signaling lanes, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. "Clock" is used herein to refer to a periodic timing signal used to coordinate actions between circuits on one or more integrated circuit devices. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:
1. An integrated circuit, comprising:
receivers, each receiver to receive and sample a respective data signal carrying a respective embedded clock, the embedded clocks generated responsive to a common timing source; and a global clock generator to generate a global clock for distribution to each of the receivers;

wherein each one of the receivers has a respective clock recovery circuit to adjust a respective clock derived from the global clock to track the respective embedded clock in dependence on locally-generated error, and the integrated circuit further comprises circuitry to control generation of the global clock dependent on an average of the locally-generated error from the respective clock recovery circuits.

2. The integrated circuit of claim 1, wherein the integrated circuit further comprises circuitry to limit change in a generation control parameter for the global clock to when the average of the locally-generated error is greater than or equal to a clock cycle of the global clock.

3. The integrated circuit of claim 1, further comprising a phase adjustment circuit to receive the global clock and to adjust a phase of the global clock as a function of a sum of the locally-generated error from the respective clock recovery circuits, wherein the circuitry to control generation of the global clock is characterized by an update rate that is slower than an adjustment rate of the phase adjustment circuit, such that the circuitry to control generation of the global clock updates the global clock responsive to an average of the locally-generated error which is not compensated for by the phase adjustment circuit.

4. The integrated circuit of claim 3, wherein the phase adjustment circuit comprises a variable-delay circuit controlled responsive to the sum of the locally-generated error.

5. The integrated circuit of claim 1, wherein each of the respective clock recovery circuits comprises a bang-bang phase detector to generate the locally-generated error as a respective phase error signal.

6. The integrated circuit of claim 1, wherein the integrated circuit comprises a phase accumulator to accumulate the locally-generated error and to produce a phase accumulator output, representing frequency error, and wherein the global clock generator is to produce the global clock as a function of the frequency error.

7. The integrated circuit of claim 6, wherein the integrated circuit comprises a frequency accumulator to accumulate the frequency error and to produce a frequency accumulator output, and wherein the global clock generator comprises a voltage controlled-oscillator to generate the global clock as a function of the frequency accumulator output.

8. The integrated circuit of claim 1, wherein the integrated circuit is to apply a low-pass filter to change in generation of the global clock, such that the global clock is changed responsive to low frequency changes in the average of the locally-generated error from the respective clock recovery circuits.

9. The integrated circuit of claim 1, wherein each respective data signal is encoded according to a format that is one of 8b10b or 64b66b, and wherein each of the receivers is to produce a respective data signal output as a respective stream of data bits.

10. An integrated circuit, comprising:

receivers, each receiver to receive and sample a respective data signal carrying a respective embedded clock, the embedded clocks generated responsive to a common timing source;

a global clock generator to generate a global clock; and a phase adjustment circuit to adjust phase of the global clock, to generate a phase-adjusted global clock for distribution to each of the receivers;

wherein each one of the receivers has a respective clock recovery circuit to adjust a respective copy of the phase-adjusted global clock to track the respective embedded clock in dependence on locally-generated error, and the integrated circuit further comprises circuitry to control generation of the global clock dependent on an average of the locally-generated error from the respective clock recovery circuits.

11. The integrated circuit of claim 10, wherein the phase adjustment circuit comprises a variable-delay circuit controlled responsive to a sum of the locally-generated error.

12. The integrated circuit of claim 11, wherein the circuitry to control generation of the global clock is characterized by an update rate that is slower than an adjustment rate of the variable-delay circuit, such that the circuitry to control generation of the global clock updates the global clock responsive to an average of the locally-generated error which is not compensated for by the variable-delay circuit.

13. The integrated circuit of claim 10, wherein the integrated circuit further comprises circuitry to limit change in a generation control parameter for the global clock to when the average of the locally-generated error is greater than or equal to a period of a clock cycle of the global clock.

14. The integrated circuit of claim 13, wherein each respective data signal is encoded according to a format that is one of 8b10b or 64b66b, and wherein each of the receivers is to produce a respective data signal output as a respective stream of data bits.

15. The integrated circuit of claim 10, wherein the integrated circuit is to apply a low-pass filter to change in generation of the global clock, such that the global clock is changed responsive to low frequency changes in the average of the locally-generated error from the respective clock recovery circuits.

16. The integrated circuit of claim 15, wherein each respective data signal is encoded according to a format that is one of 8b10b or 64b66b, and wherein each of the receivers is to produce a respective data signal output as a respective stream of data bits.

17. A method, comprising:

with integrated circuit receivers, receiving and sampling respective data signals each carrying a respective embedded clock, the embedded clocks generated responsive to a common timing source; and using a global clock generator to generate a global clock for distribution to each of the receivers;

wherein the method further comprises using a clock recovery circuit respective to each one of the receivers to adjust a respective clock derived from the global clock, to track the respective embedded clock in dependence on locally-generated error, and using circuitry to control generation of the global clock dependent on an average of the locally-generated error from the respective clock recovery circuits.

18. The method of claim 17, further comprises limiting change in generation of the global clock to when the average of the locally-generated error is greater than or equal to a period of a clock cycle of the global clock.

19. The method of claim 17, further comprising adjusting phase of the global clock as a function of a sum of the locally-generated error from the respective clock recovery circuits, and controlling change in generation of the global clock according to an update rate that is slower than an adjustment rate of phase adjustment.

20. The method of claim 19, wherein adjusting phase comprises controlling a variable-delay circuit controlled responsive to the sum of the locally-generated error.

* * * * *